(12) United States Patent
Kadoguchi et al.

(10) Patent No.: US 9,824,961 B2
(45) Date of Patent: Nov. 21, 2017

(54) SEMICONDUCTOR DEVICE

(71) Applicant: TOYOTA JIDOSHA KABUSHIKI KAISHA, Toyota-shi, Aichi-ken (JP)

(72) Inventors: Takuya Kadoguchi, Toyota (JP); Takanori Kawashima, Anjo (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 15/590,572

(22) Filed: May 9, 2017

(65) Prior Publication Data

US 2017/0243812 A1   Aug. 24, 2017

Related U.S. Application Data

(62) Division of application No. 15/036,089, filed as application No. PCT/IB2014/002403 on Nov. 11, 2014.

(30) Foreign Application Priority Data

Nov. 26, 2013 (JP) .................................. 2013-244325

(51) Int. Cl.
  *H01L 21/00* (2006.01)
  *H01L 23/495* (2006.01)
  (Continued)

(52) U.S. Cl.
  CPC ...... *H01L 23/49582* (2013.01); *H01L 23/498* (2013.01); *H01L 23/48* (2013.01);
  (Continued)

(58) Field of Classification Search
  CPC .. H01L 23/49582; H01L 23/498; H01L 24/29
  See application file for complete search history.

(56) References Cited

U.S. PATENT DOCUMENTS 6,281,524 B1 * 8/2001 Yamamoto ............. H01L 24/24
  257/99
6,474,531 B2 * 11/2002 Ozawa ................... H01L 33/40
  228/103

(Continued)

FOREIGN PATENT DOCUMENTS

EP   2546869 A1   1/2013
JP   H06-77633 A   3/1994

(Continued)

OTHER PUBLICATIONS

May 8, 2017 Office Action Issued in U.S. Appl. No. 15/036,089.
Aug. 28, 2017 Office Action issued in U.S. Appl. No. 15/036,089.

*Primary Examiner* — Laura Menz
(74) *Attorney, Agent, or Firm* — Oliff PLC

(57) ABSTRACT

A semiconductor device includes a substrate, a semiconductor element, a terminal and a solder outflow prevention part. The semiconductor element is fixed on one side of the substrate via a first solder layer. The terminal that is fixed on the one side of the substrate via a second solder layer. The solder outflow prevention part is formed between the semiconductor element and the terminal in the one side of the substrate and is configured to prevent the first solder layer and the second solder layer from outflowing. A distance between the solder outflow prevention part and the semiconductor element is longer than a thickness of the first solder layer.

7 Claims, 7 Drawing Sheets

(51) Int. Cl.
  *H01L 23/498* (2006.01)
  *H01L 23/49* (2006.01)
  *H01L 23/528* (2006.01)
  *H01L 23/48* (2006.01)
  *H01L 23/00* (2006.01)

(52) U.S. Cl.
  CPC ............ *H01L 23/49* (2013.01); *H01L 23/528* (2013.01); *H01L 24/29* (2013.01)

(56) References Cited

U.S. PATENT DOCUMENTS

| | | | |
|---|---|---|---|
| 6,965,552 B2* | 11/2005 | Tokuda | G11B 7/127 228/180.22 |
| 2003/0147333 A1* | 8/2003 | Tokuda | G11B 7/127 369/121 |
| 2005/0029666 A1* | 2/2005 | Kurihara | H01L 21/561 257/772 |
| 2011/0037166 A1 | 2/2011 | Ikeda et al. | |
| 2013/0249100 A1 | 9/2013 | Morishita et al. | |
| 2015/0250051 A1* | 9/2015 | Yumoto | H05K 3/3484 174/258 |
| 2016/0293561 A1* | 10/2016 | Kadoguchi | H01L 23/3735 |

FOREIGN PATENT DOCUMENTS

| | | | | |
|---|---|---|---|---|
| JP | H06-237073 A | | 8/1994 | |
| JP | H07-111370 A | | 4/1995 | |
| JP | H11-284318 A | | 10/1999 | |
| JP | 2000-357861 A | | 12/2000 | |
| JP | 2001-053432 A | | 2/2001 | |
| JP | 2001-257444 A | | 9/2001 | |
| JP | 2003-092464 A | | 3/2003 | |
| JP | 2004-363216 A | | 12/2004 | |
| JP | 2007-027584 A | | 2/2007 | |
| JP | 2007-088020 A | | 4/2007 | |
| JP | 2007-088021 A | | 4/2007 | |
| JP | 4007304 B2 | | 11/2007 | |
| JP | 2010-153431 A | | 7/2010 | |
| JP | 2012-129336 A | | 7/2012 | |
| JP | 2013-034029 A | | 2/2013 | |
| JP | 2013-197432 A | | 9/2013 | |
| JP | 2015103713 A | * | 6/2015 | ......... H01L 23/3735 |
| JP | WO 2015079294 A2 | * | 6/2015 | ......... H01L 23/3735 |

* cited by examiner

SEMICONDUCTOR DEVICE

This application is a divisional application of U.S. patent application Ser. No. 15/036,089 filed May 12, 2016, which is in turn a U.S. National Stage of International Application. No. PCT/IB2014/002403, filed Nov. 11, 2014, which claims the benefit of Japanese Patent Application No. 2013-244325 filed Nov. 26, 2013. The disclosure of the prior applications is hereby incorporated by reference herein in their entirety.

BACKGROUND OF THE INVENTION

1. Field of the Invention

The present invention relates to a semiconductor device.

2. Description of Related Art

As a semiconductor device in which a semiconductor element and a terminal are mounted on a substrate, for example, a semiconductor device that is mounted on a vehicle and has a function of power control and the like is known. In the semiconductor device, the substrate and the semiconductor element are fixed via a first solder layer and the substrate and the terminal are fixed via a second solder layer.

However, in the semiconductor device described above, since the semiconductor element and the terminal are disposed in the proximity of each other, there has been some cases that the second solder layer that bonds the substrate and the terminal outflows toward the semiconductor element during soldering, establishes electrical continuity with the semiconductor element, and prevents the semiconductor device from being operated normally.

SUMMARY OF THE INVENTION

The present invention provides a semiconductor device that can prevent a solder that forms a solder layer from outflowing toward other member.

A semiconductor device according to an aspect of the present invention includes a substrate, a semiconductor element, a terminal and a solder outflow prevention part. The semiconductor element is fixed on one side of the substrate via a first solder layer. The terminal is fixed on the one side of the substrate via a second solder layer. The solder outflow prevention part is provided between the semiconductor element and the terminal in the one side of the substrate and is configured to prevent the first solder layer and the second solder layer from outflowing. A distance between the solder outflow prevention part and the semiconductor element is longer than a thickness of the first solder layer.

According to the aspect of the present invention, the semiconductor device that can prevent the solder that forms the solder layer from outflowing toward other member can be provided.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
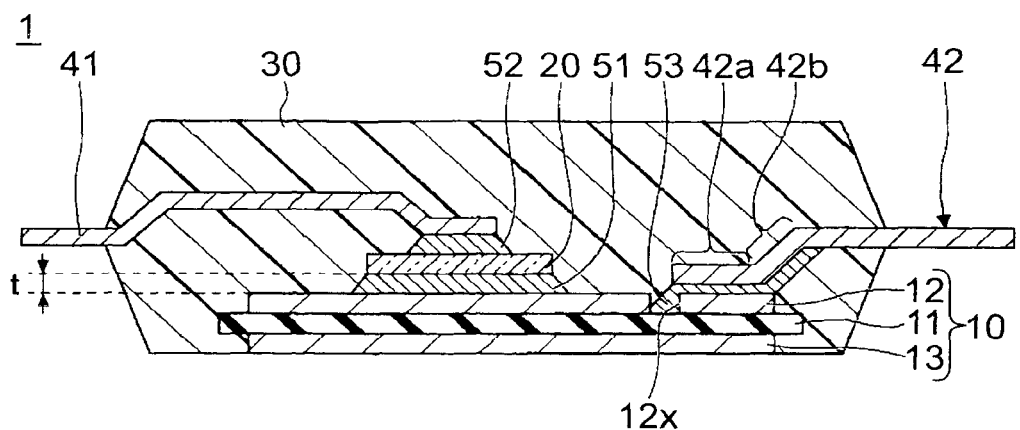
FIG. 1 is a cross-sectional view that shows a semiconductor device according to a first embodiment of the present invention.

Hereinafter, with reference to the drawings, modes for carrying out the invention will be described. In each of the drawings, the like members are imparted with the like reference numerals, and duplicated descriptions will be omitted in some cases.

First Embodiment

Figure 2:
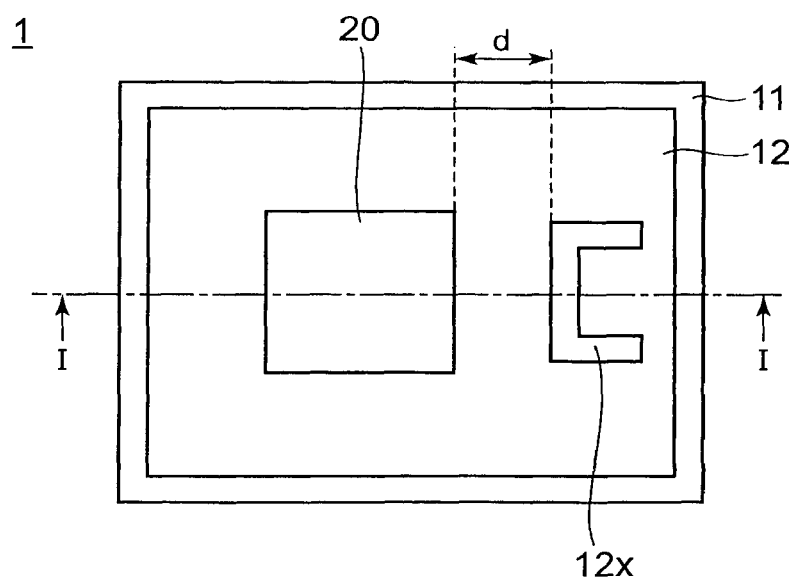
FIG. 2 is a plan view that shows the semiconductor device according to the first embodiment.

FIG. 1 is a cross-sectional view that shows a semiconductor device according to a first embodiment of the present invention. FIG. 2 is a plan view that shows the semiconductor device according to the first embodiment. However, in FIG. 2, only a part of members shown in FIG. 1 is shown. Further, FIG. 1 shows a cross-section along a I-I line of FIG. 2.

When referring to FIG. 1 and FIG. 2, a semiconductor device 1 includes a substrate 10, a semiconductor element 20, a sealing resin 30, and terminals 41 and 42. The substrate 10 includes an insulating layer 11, a first wiring layer 12 and a second wiring layer 13.

In the present embodiment, for convenience sake, the terminal 41 side is taken as an upper side or one side of the substrate 10, a second wiring layer 13 side is taken as a lower side or the other side of the substrate 10. Further, a surface on the terminal 41 side of the respective sites is taken as an upper surface or one surface, and a surface on the second wiring layer 13 side is taken as a lower surface or the other surface. However, the semiconductor device 1 can be used in an upside-down state, or can be disposed at an arbitrary angle. Further, a plan view indicates to see a subject matter from a normal line direction of one surface of the insulating layer 11, and a planar shape indicates a shape when the subject matter is seen from the normal line direction of one surface of the insulating layer 11.

The insulating layer 11 is formed of an insulating material such as ceramics, for example. When the insulating layer 11 is formed of the ceramics, as a. material, for example, silicon nitride ($Si_3N_4$), aluminum oxide ($Al_2O_3$), aluminum nitride (AlN) or the like can be used. However, the material of the insulating layer 11 is not limited to the ceramics, an insulating resin, glass and the like may be used. The planar shape of the insulating layer 11 may be a square, a rectangle or the like having a side of about 30 to 50 mm. A thickness of the insulating layer 11 may be, for example, about 0.2 to 1.5 mm.

The first wiring layer 12 is bonded to one surface of the insulating layer 11, by, for example, brazing or the like. The first wiring layer 12 may be disposed over an entire surface of one surface of the insulating layer 11 or, for example, may be disposed such that an outer periphery part of one surface of the insulating layer 11 is exposed. As a material of the first wiring layer 12, for example, copper (Cu), aluminum (Al) or the like may be used. A thickness of the first wiring layer 12 may be, for example, about 0.2 to 1 mm.

When the first wiring layer 12 is made of a material having a poor solder wetting property such as aluminum (Al), a surface treatment film (a plating film or the like) such as nickel (Ni) or gold (Au) having an excellent solder wetting property is preferably formed on a surface of the first wiring layer 12.

In the first wiring layer 12, a groove 12x (through groove) that exposes one surface of the insulating layer 11 is formed. The groove 12x is formed on a terminal 42 side of the semiconductor element 20. The groove 12x is a typical example of a solder outflow prevention part according to the present invention. A planar shape of the groove 12x may be, for example, a U-shape that opens on an opposite side from the semiconductor element 20.

A distance d between the groove 12x and the semiconductor element 20 is set longer than a thickness t of a solder layer 51. For example, when the thickness t of the solder layer 51 is 0.1 mm, in order to prevent electrical continuity between the semiconductor element 20 and the terminal 42, as the distance d between the groove 12x and the semiconductor element 20, at least about 0.15 mm is necessary. However, as long as the distance d is longer than the thickness t, the distance d may be set to any length.

The reason why the distance d between the groove 12x and the semiconductor element 20 is set longer than the thickness t of the solder layer 51 is as follows. That is, since a solder fillet usually forms an angle of inclination of about 45° to 90°, a tip of the fillet of the solder layer 51 extends at most only to an extent the same as the thickness t of the solder layer 51 from an end surface of the semiconductor element 20.

Therefore, when the distance d between the groove 12x and the semiconductor element 20 is set longer than the thickness t of the solder layer 51, the fillet of the solder layer 51 can be prevented from reaching the groove 12x and establishing an electrical continuity with a solder layer 53 in the groove 12x.

As can be understood from the reason described above, when an electrode (a part that contacts with an upper surface of the solder layer 51) on a lower surface side of the semiconductor element 20 is smaller than an outer periphery of the semiconductor element 20, a starting point of the distance d is preferably set to a part closest to the groove 12x of the electrode on the lower surface side of the semiconductor element 20. According to the present application, the distance d between the groove 12x and the semiconductor element 20 is represented by including also such a case.

On the other hand, the solder that forms the solder layer 53 is also required not to reach the solder layer 51. Regarding this, a relationship between an amount of the solder (that forms the solder layer 53 after curing) and a volume of the groove 12x is important. This will be described below.

The second wiring layer 13 is bonded to the other surface of the insulating layer 11 by, for example, brazing or the like. The second wiring layer 13 may be disposed over an entire surface of the other surface of the insulating layer 11, or, for example, may be disposed such that an outer periphery part of the other surface of the insulating layer 11 is exposed. As a material of the second wiring layer 13, for example, copper (Cu), aluminum (Al) or the like may be used. A thickness of the second wiring layer 13 may be set to, for example, about 0.2 to 1 mm.

When the second wiring layer 13 is made of a material having a poor solder wetting property such as aluminum (Al), a surface treatment film (a plating film or the like) such as nickel (Ni) or gold (Au) having an excellent solder wetting property is preferably formed on a surface of the second wiring layer 13.

The semiconductor element 20 is mounted in a predetermined element mounting region on the first wiring layer 12 of the substrate 10. An electrode on a lower surface side of the semiconductor element 20 is electrically connected with the first wiring layer 12 via the solder layer 51. The semiconductor element 20 is, for example, a switching element for electric power, which generates heat during operation of an IGBT (Insulated Gate Bipolar Transistor) or the like that constitutes an inverter circuit. The heat that the semiconductor element 20 generates is radiated via the substrate 10. By disposing a heat radiation component on the second wiring layer 13 side, a heat radiation property may be further improved. Like this, since the semiconductor device 1 radiates the heat that the semiconductor element 20 generates from one surface side (a lower surface side), the semiconductor device 1 can be called a one-sided cooling module.

The sealing resin 30 is formed so as to cover the substrate 10, the semiconductor element 20, and the terminals 41 and 42. The sealing resin 30 can be formed by transfer molding or the like, for example, with an insulting material such as an epoxy resin that contains a filler. When the sealing resin 30 is formed, the semiconductor element 20 or the like can be protected from moisture, contaminant or the like. The lower surface of the second wiring layer 13 and a part of the terminals 41 and 42 are exposed from the sealing resin 30.

The terminal 41 is electrically connected with the semiconductor element 20. One end of the terminal 41 is bonded to an electrode on an upper surface side of the semiconductor element 20 via a solder layer 52. The other end of the terminal 41 is exposed outside from the sealing resin 30. The terminal 41 is formed by processing a lead frame base material made of, for example, copper (Cu) or the like.

The terminal 42 is electrically connected to the first wiring layer 12. A leading end part of one end of the terminal 42 has a connection part 42a. A bent part 42b is formed over from the leading end part of the one end to the other end part. A part from the connection part 42a to the bent part 42b is a connection surface to the first wiring layer 12, and the connection surface is bonded with the first wiring layer 12 via the solder layer 53. The one end of the terminal 42 is fixed above the groove 12x.

The connection part 42a of the terminal 42 is preferable to be fixed at a position that overlaps with the groove 12x in a plan view This is because when the connection part 42a of the terminal 42 does not overlap with the groove 12x in a plan view and is located on an outer periphery side of the substrate 10 than the groove 12x, a distance between the superfluous solder and the groove 12x becomes long and it becomes difficult for the superfluous solder to enter into the groove 12x. On the other hand, this is because when the connection part 42a of the terminal 42 does not overlap with the groove 12x in a plan view and is located on a semiconductor element 20 side than the groove 12x, the superfluous solder may outflow from the groove 12x to the semiconductor element 20 side.

The other end of the terminal 42 is exposed outside from the sealing resin 30. The terminal 42 is formed by processing a lead frame base material made of, for example, copper (Cu) or the like. The solder layer 53 is formed such that it enters in the groove 12x, extends on the first wiring layer 12 in a direction away from the semiconductor element 20, and further covers a lower surface of the bent part 42b of the terminal 42 (forms a back fillet).

Since the groove 12x is formed like this, when the terminal 42 is soldered to the first wiring layer 12, the superfluous solder enters in the groove 12x even when an amount of melted solder (that becomes the solder layer 53 after curing) is large. Further, a part of the superfluous solder forms a back fillet on the lower surface of the bent part 42b of the terminal 42. Thus, since the superfluous solder does not outflow onto the first wiring layer 12 on the semiconductor element 20 side, the solder layer 53 can be prevented from being connected with the solder layer 51 and the semiconductor element 20. Further, due to the back fillet formed on the lower surface of the bent part 42b of the terminal 42, connection reliability between the terminal 42 and the first wiring layer 12 can be improved.

When the groove 12x is formed, the first wiring layer 12 in which a through hole that becomes the groove 12x is formed in advance may well be brazed to the insulating layer 11. Alternatively, after the first wiring layer 12 in which the through hole is not formed is brazed to the insulating layer 11, a resist in which a portion that becomes the groove 12x is opened is formed on the first wiring layer 12, and by removing the first wiring layer 12 exposed in the resist by etching, the groove 12x may be formed.

Here, an amount of the solder (that becomes the solder layer 53 after curing) and a volume of the groove 12x will be described. When the terminal 42 is soldered to the first wiring layer 12, the followings are mainly considered as variation factors. A first factor is a variance in a bonding area between the terminal 42 side and the first wiring layer 12 side. A second factor is a variance in a bonding thickness between the terminal 42 and the first wiring layer 12 (a thickness of the solder layer 53 between planes of the terminal 42 and the first wiring layer 12 that face with each other). A third factor is a variance in an amount of the solder (that becomes the solder layer 53 after curing).

Figure 3A:
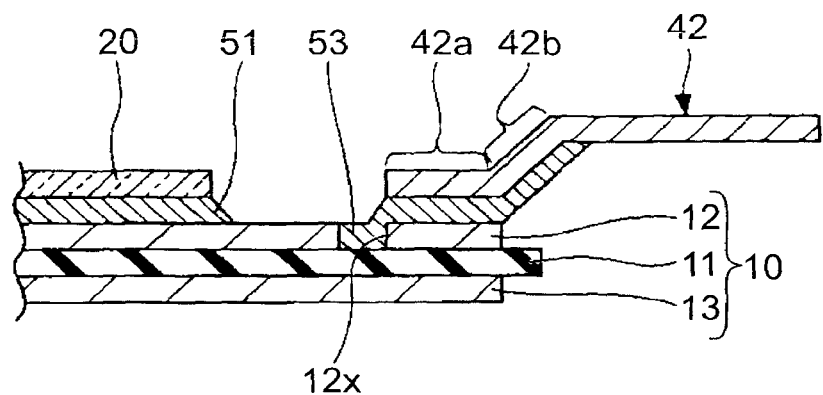
FIGS. 3A and 3B are diagrams for describing an amount of a solder and a volume of a groove.

First, a case where the bonding area that is the first factor is minimum, the bonding thickness that is the second factor is minimum, and the amount of the solder that is the third factor is maximum is considered. In this case, the volume of the groove 12x may be determined such that "the superfluous part of the solder a minimum value of the volume of the grove 12x" (a state of FIG. 3A). Although a maximum value of the volume of the groove 12x is determined according to a restraint on a dimension or the like, there is no restriction on the maximum value.

Figure 3B:
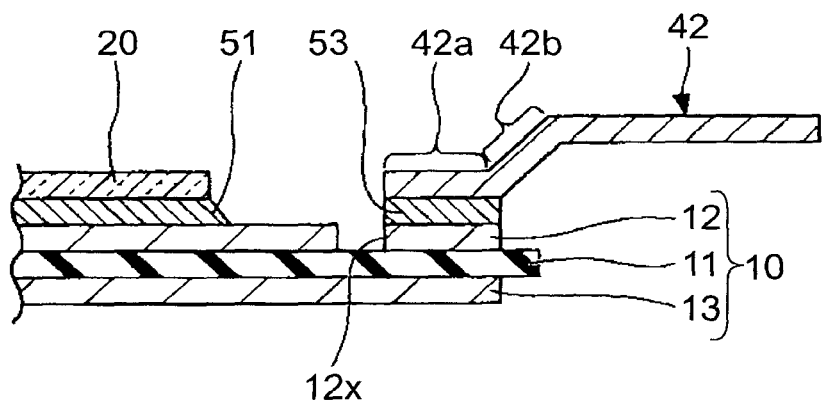

Next, a case where the bonding area that is the first factor is maximum, the bonding thickness that is the second factor is maximum, and the amount of the solder that is the third factor is minimum is considered. In this case, a minimum value of the amount of the solder may be determined such that the superfluous solder does not occur (a state shown in FIG. 3B).

As described above, when, by considering the first to the third factors, the amount of the solder (that becomes the solder layer 53 after curing) and the volume of the groove 12x are adjusted such that design values (the bonding area, bonding thickness) are satisfied, the superfluous solder can be prevented from outflowing from the groove 12x to the semiconductor element 20 side.

Figure 4:
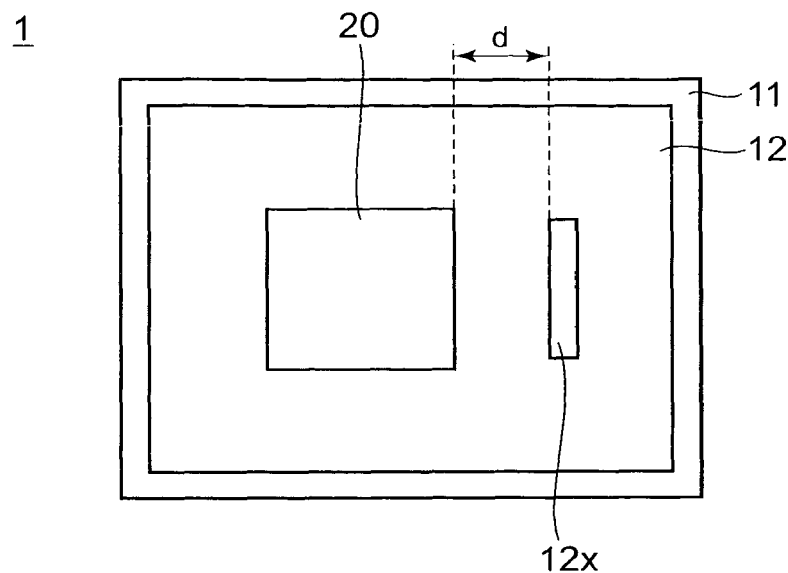
FIG. 4 is a plan view that shows another example of a shape of the groove.

When the amount of the solder (that becomes the solder layer 53 after curing) and the volume of the groove 12x are adjusted, it is not necessarily required for the planar shape of the groove 12x to have the U-shape. The planar shape of the groove 12x may be a linear shape (I-shape) as shown in FIG. 4, for example. Alternatively the planar shape of the groove 12x may be, for example, a C-shape that opens on an opposite side from the semiconductor element 20 or the like (not shown in the drawing).

Second Embodiment

Figure 5:
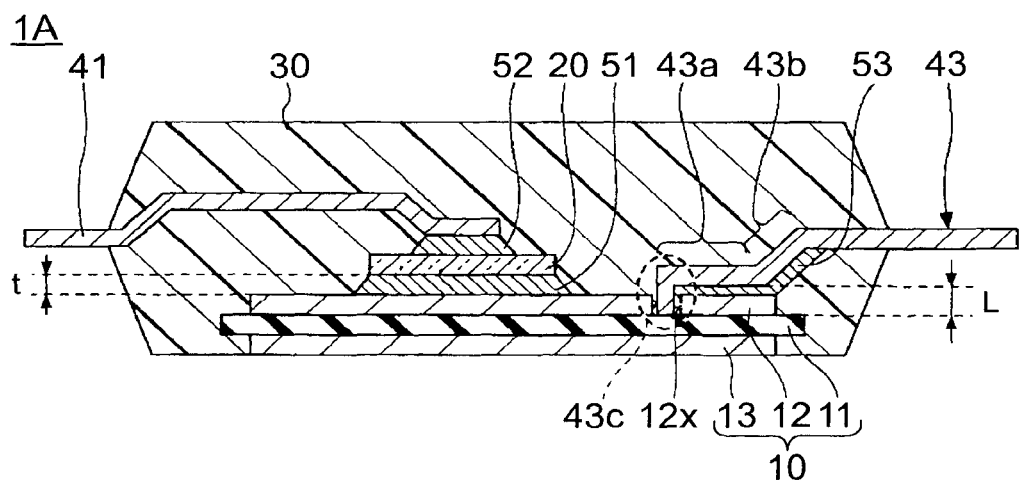
FIG. 5 is a cross-sectional view that shows a semiconductor device according to a second embodiment of the present invention.

FIG. 5 is a cross-sectional view that shows a semiconductor device according to a second embodiment. When referring to FIG. 5, a semiconductor device 1A is different from the semiconductor device 1 in a point that the terminal 42 is substituted with a terminal 43 (see FIG. 1 or the like). In FIG. 5, descriptions of the same constituent parts as those of the embodiment described above will be omitted.

The terminal 43 is electrically connected to the first wiring layer 12. At A leading end part of one end of the terminal 43 has a connection part 43a A bending part 43b is formed over from the leading end part of the one end to the other end part. A part from the connection part 43a (that contains a bent part 43c described below) to the bending part 43b is a connection surface to the first wiring layer 12, and the connection surface is bonded to the first wiring layer 12 via the solder layer 53. The one end of the terminal 43 is fixed above the groove 12x.

The connection part 43a of the terminal 43 has, at its leading end part, the bent part 43c that bends from a direction substantially parallel with the first wiring layer 12 to a direction substantially vertical to the first wiring layer 12. The bent part 43c is inserted in the groove 12x and a tip surface of the bent part 43c contacts with one surface of the insulating layer 11 that is exposed in the groove 12x. By forming thus, the leading end part (bent part 43c) of the connection part 43a of the terminal 43 is fixed to a position that overlaps with the groove 12x in a plan view.

The other end of the terminal 43 is exposed outside from the sealing resin 30. The terminal 43 is formed by processing a lead frame base material made of copper (Cu) or the like. The solder layer 53 is formed such that it enters in the groove 12x, extends on the first wiring layer 12 in a direction away from the semiconductor element 20, and further covers a lower surface of the bending part 43h of the terminal 43 (forms the back fillet).

The planar shape of the groove 12x may be one shown in FIG. 2, one shown in FIG. 4, or other than those.

The second embodiment further exerts the following effect in addition to the effect of the first embodiment. That is, by providing the bent part 43c to the leading part of the connection part 43a of the terminal 43, without using a particular jig, the terminal 43 can be readily positioned with respect to the substrate 10.

Further, since the tip surface of the bent part 43c contacts with one surface of the insulating layer 11 exposed in the groove 12x, the thickness of the solder layer 53 is determined by a length L of the bent part 43c. Therefore, accuracy of the thickness of the solder layer 53 can be improved.

Third Embodiment

Figure 6:
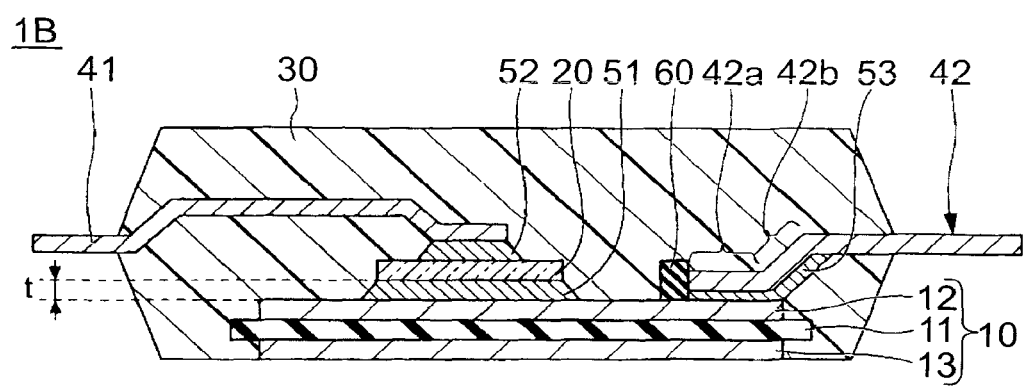
FIG. 6 is a cross-sectional view that shows a semiconductor device according to a third embodiment of the present invention.
Figure 7:
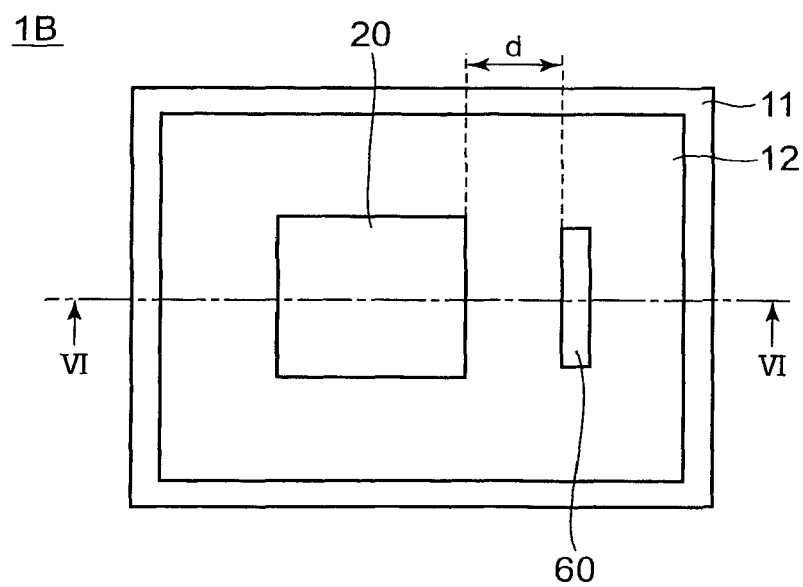
FIG. 7 is a plan view that shows the semiconductor device according to the third embodiment.

FIG. 6 is a cross-sectional view that shows a semiconductor device according to a third embodiment. FIG. 7 is a plan view that shows the semiconductor device according to the third embodiment. However, in FIG. 7, only a part of the members shown in FIG. 6 is shown. Further, FIG. 6 shows a cross-section along a VI-VI line of FIG. 7.

When referring to HG. 6 and FIG. 7, a semiconductor device 1B is different from the semiconductor device 1 in points that the first wiring layer 12 is not provided with the groove 12x and an insulating material 60 is disposed on the first wiring layer 12 (see FIG. 1 and the like). In FIG. 6 and FIG. 7, descriptions of the same constituent parts as those of the embodiments described above will be omitted.

The insulating material 60 is fixed on an upper surface of the first wiring layer 12 by, for example, an insulating adhesive or the like. The insulating material 60 is disposed on the terminal 42 side of the semiconductor element 20. The insulating material 60 is a typical example of the solder outflow prevention part according to the present invention. As a material of the insulating material 60, an insulating resin, for example, such as an epoxy resin may be used. Alternatively, the insulating material 60 may be formed by covering a surface of a conductive material such as metal with an insulating film. A planar shape of the insulating material 60 may have a linear shape (I-shape), for example. Alternatively, the U-shape the same as that of FIG. 2, a C-shape (not shown in the drawing) or the like may be used.

A distance d between the insulating material 60 and the semiconductor element 20 is being set longer than the thickness t of the solder layer 51. For example, when the thickness t of the solder layer 51 is 0.1 mm, in order to prevent electrical continuity between the semiconductor element 20 and the terminal 42, as the distance d between the insulating material 60 and the semiconductor element 20, at least about 0.15 mm is necessary. However, as long as the distance d is longer than the thickness t, the distance d may be set to any length.

A height of the insulating material 60 is set higher than a value obtained by adding the thickness of the terminal 42 to a height of the solder layer 53. A tip of one end of the terminal 42 contacts with a side surface of the insulating material 60. By disposing the insulating material 60 that protrudes from an upper surface of the first wiring layer 12 like this, when the terminal 42 is soldered, the tip of the one end of the terminal 42 is positioned in contact with the side surface of the insulating material 60. Therefore, without using a particularly jig, the terminal 42 can be readily positioned with respect to the substrate 10.

Further, since the insulating material 60 is protruded from the upper surface of the first wiring layer 12, when the terminal 42 is soldered to the first wiring layer 12, the superfluous solder can be stemmed even when an amount of the solder in a molten state (that becomes the solder layer 53 after curing) is large. Further, a part of the superfluous solder forms the back fillet on the lower surface of the bent part 42b of the terminal 42. Thus, since the superfluous solder does not outflow on the first wiring layer 12 on the semiconductor element 20 side, the solder layer 53 can be prevented from being connected with the solder layer 51 and the semiconductor element 20. Further, by the back fillet formed on the lower surface of the bent part 42b of the terminal 42, the connection reliability between the terminal 42 and the first wiring layer 12 can be improved.

Fourth Embodiment

Figure 8:
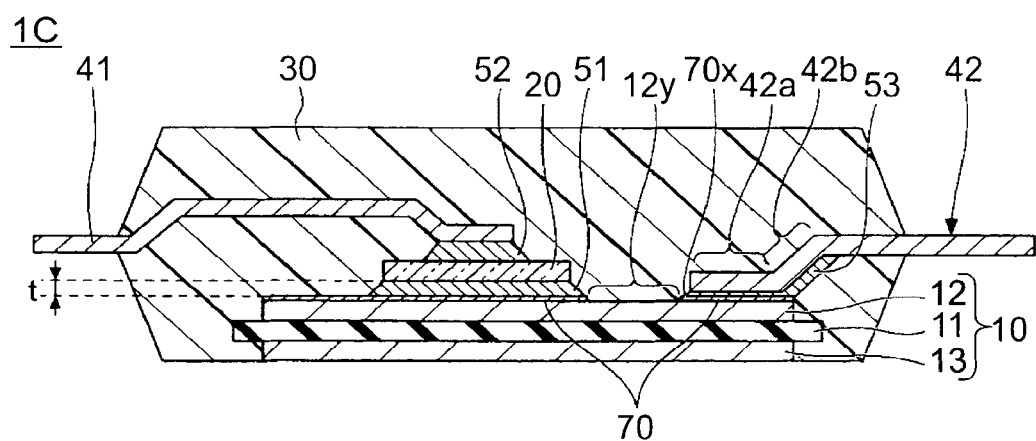
FIG. 8 is a cross-sectional view that shows a semiconductor device according to a fourth embodiment of the present invention.
Figure 9:
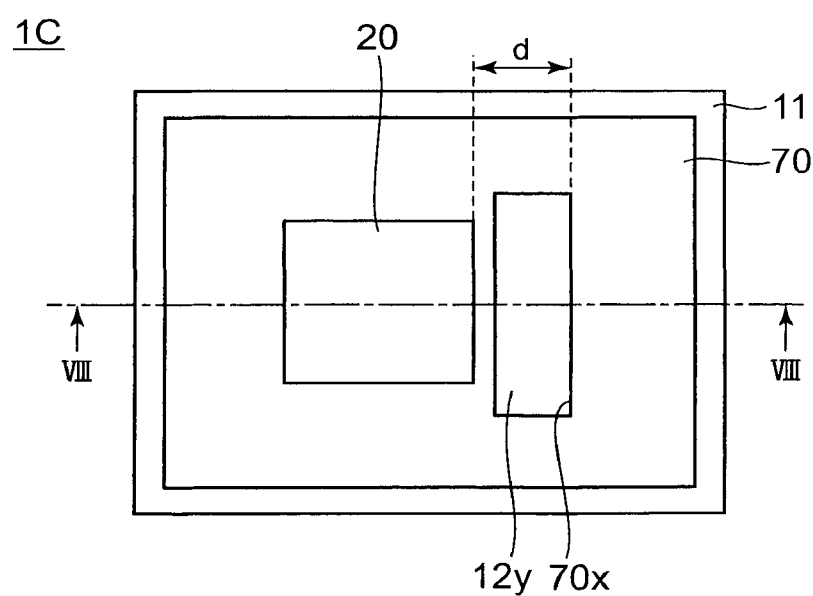
FIG. 9 is a plan view that shows the semiconductor device according to the fourth embodiment.

FIG. 8 is a cross-sectional view that shows a semiconductor device according to a fourth embodiment. FIG. 9 is a plan view that shows the semiconductor device according to the fourth embodiment. However, in FIG. 9, only a part of members shown in FIG. 8 is shown. Further, FIG. 8 shows a cross-section along a line of FIG. 9.

When referring to FIG. 8 and FIG. 9, a semiconductor device 1C is different from the semiconductor device 1 in points that the upper surface of the first wiring layer 12 is covered with a surface treatment film 70 and an opening part 70x. that exposes the upper surface of the first wiring layer 12 is formed on a part of the surface treatment film 70 (see FIG. 1 and the like). In FIG. 8 and FIG. 9, descriptions of the same constituent parts as those of the embodiments described above will be omitted.

In the present embodiment, the first wiring layer 12 is made of a material having a poor solder wetting property such as aluminum (Al) and the upper surface of the first wiring layer 12 is covered with the surface treatment film 70 having an excellent solder wetting property such as nickel (Ni) or gold (Au). Then, by forming the opening part 70x on the terminal 42 side of the semiconductor element 20 of the surface treatment film 70, and the upper surface of the first wiring layer 12 is exposed in the opening part 70x. That is, only a part of the upper surface of the first wiring layer 12 that is exposed in the opening part 70x becomes a non-soldered region 12y having a poor solder wetting property, and other region becomes a solder region having an excellent solder wetting property. The non-soldered region 12y is a typical example of the solder outflow prevention part according to the present invention.

The planar shape of the non-soldered region 12y (opening part 70x) may be, for example, rectangular. Alternatively, by further elongating the non-soldered region 12y, the surface treatment film 70 may be divided in two of a region on the terminal 41 side and a region on the terminal 42 side.

A distance d between a side on the terminal 42 side of the non-soldered region 12y and the semiconductor element 20 is set longer than the thickness t of the solder layer 51. For example, when the thickness t of the solder layer 51 is 0.1 mm, in order to prevent electrical continuity between the semiconductor element 20 and the terminal 42, as the distance d between the side on the terminal 42 side of the non-soldered region 12y and the semiconductor element 20, at least about 0.15 mm is necessary. However, as long as distance d is longer than the thickness t, the distance d may be set to any length.

The surface treatment film 70 having the opening part 70x on the upper surface of the first wiring layer 12 is formed, for example, as shown below. Firstly, the substrate 10 is prepared. In the substrate, the first wiring layer 12 (aluminum or the like) is disposed on one surface of the insulating layer 11 and the second wiring layer 13 is disposed on the other surface. Then, on a part in which the opening part 70x of the upper surface of the first wiring layer 12 is to be formed, a mask such as a resist film or a masking tape is formed. Then, on the upper surface of the first wiring layer 12, for example, by plating, the surface treatment film 70 such as nickel (Ni) or gold (Au) is formed, and after that, the mask is removed. Thus, the surface treatment film 70 having the opening part 70x on the upper surface of the first wiring layer 12 is formed, and an inside of the opening part 70x becomes the non-soldered region 12y.

Since the non-soldered region 12y is formed like this, when the terminal 42 is soldered to the first wiring layer 12, the superfluous solder neither wets the non-soldered region 12y nor expands thereto and becomes the back fillet on the lower surface of the bent part 42b of the terminal 42 even when an amount of the solder in a molten state (that becomes the solder layer 53 after curing) is large. Thus, since the superfluous solder does not outflow on the first wiring layer 12 on the semiconductor element 20 side, the solder layer 53 can be prevented from being connected with the solder layer 51 and the semiconductor element 20. Further, due to the back fillet formed on the lower surface of the bent part 42b of the terminal 42, the connection reliability between the terminal 42 and the first wiring layer 12 can be improved.

Fifth Embodiment

Figure 10:
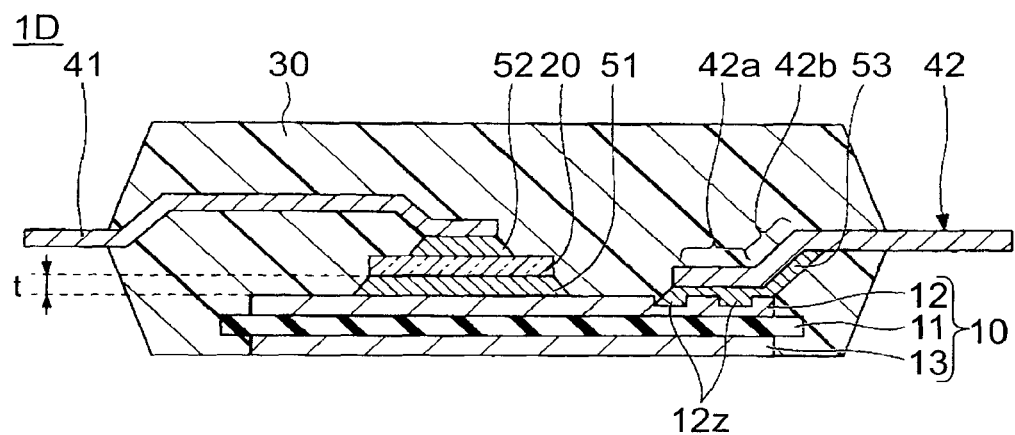
FIG. 10 is a cross-sectional view that shows a semiconductor device according to a fifth embodiment of the present invention.
Figure 11:
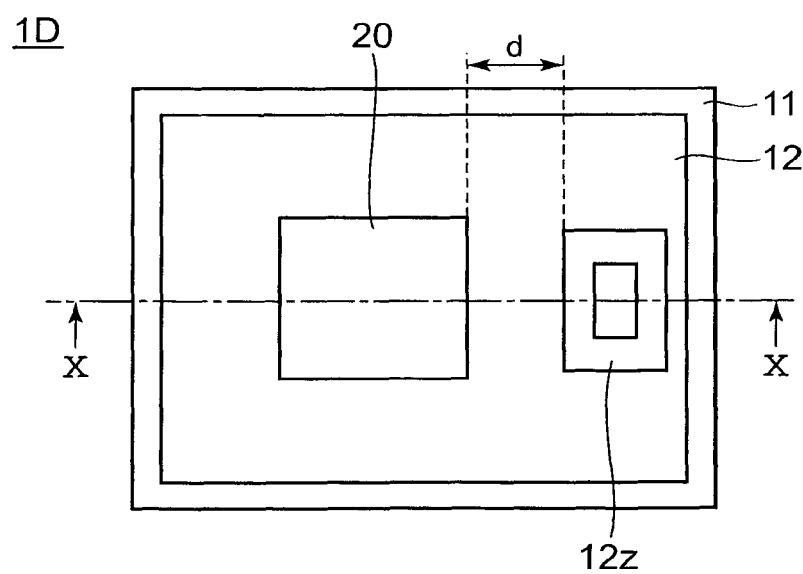
FIG. 11 is a plan view that shows the semiconductor device according to the fifth embodiment.

FIG. 10 is a cross-sectional view that shows a semiconductor device according to a fifth embodiment. FIG. 11 is a plan view that shows the semiconductor device according to the fifth embodiment. However, in FIG. 11, only a part of the members shown in FIG. 10 is shown. Further, FIG. 10 shows a cross-section along a X-X line of FIG. 11.

When referring to FIG. 10 and FIG. 11, a semiconductor device I D is different from the semiconductor device 1 in a point that the groove 12x is substituted with grooves 12z (see FIG. 1 and the like). In FIG. 10 and FIG. 11, descriptions of the same constituent parts as those of the embodiments described above will be omitted.

In the first wiring layer 12, the grooves 12z that do not penetrate through the first wiring layer 12 are formed. The grooves 12z are formed on the terminal 42 side of the semiconductor element 20. The grooves 12z are a typical example of the solder outflow prevention part according to the present invention. The planar shape of the groove 12z can be set to a case shape (frame shape). Distances d between the grooves 12z and the semiconductor element 20 are set longer than the thickness t of the solder layer 51. For example, when the thickness t of the solder layer 51 is 0.1 mm, in order to prevent the electrical continuity between the semiconductor element 20 and the terminal 42, as the distances d between the grooves 12z and the semiconductor element 20, at least about 0.15 mm is necessary. However, as long as the distance d is longer than the thickness t, the distance d may be set to any length. The adjustment between the amount of the solder (that becomes the solder layer 53 after curing) and a volume of the groove 12z is the same as the case of the groove 12x described in the first embodiment.

Since in the groove 12x (see FIG. 1 and the like), one surface of the insulating layer 11 is exposed on a bottom part, the solder wetting property was poor in the groove 12x. On the other hand, the solder wetting property is excellent in the inside of the grooves 12z. That is, when the first wiring layer 12 is made of a material having excellent solder wetting property such as copper (Cu), the material having the excellent solder wetting property such as copper (Cu) is exposed also in the grooves 12z. Further, when the first wiring layer 12 is made of a material having poor solder wetting property such as aluminum (Al), a surface treatment film having excellent solder wetting property is formed after the grooves 12z are formed. Thus, the surface treatment film having excellent solder wetting property is exposed also in the grooves 12z.

The grooves 12z may be formed in the first wiring layer 12, for example, as shown below. Firstly, the substrate 10 is prepared. In the substrate 10, the first wiring layer 12 is disposed on one surface of the insulating layer 11 and the second wiring layer 13 is disposed on the other surface. Then, the first wiring layer 12 is molded by pressing with a metal mold having projection parts corresponding to shapes of the grooves 12z (at this time, the grooves 12z are controlled so as not to penetrate through the first wiring layer 12). Thus, the grooves 12z are formed in the first wiring layer 12. After that, as required, on an upper surface of the first wiring layer 12 including the insides of the grooves 12z, the surface treatment film such as nickel (Ni) or gold (Au) is formed, for example, by plating.

The fifth embodiment further exerts the following effect in addition to the effect of the first embodiment. That is, since the inside of the groove 12z is in a state of excellent solder wetting property, when the terminal 42 is soldered to the first wiring layer 12, due to a capillary phenomenon, the solder in a molten state actively enters into the grooves 12z, and the superfluous solder can be readily absorbed. The planar shape of the grooves 12z may not be the case shape (frame shape), may be a shape shown in FIG. 2 or a shape shown in FIG. 4, or may be other than those. In essence, as long as the inside of the groove 12z has an excellent solder wetting property, due to the capillary phenomenon, effects specific to the present embodiment can be obtained.

Sixth Embodiment

Figure 12:
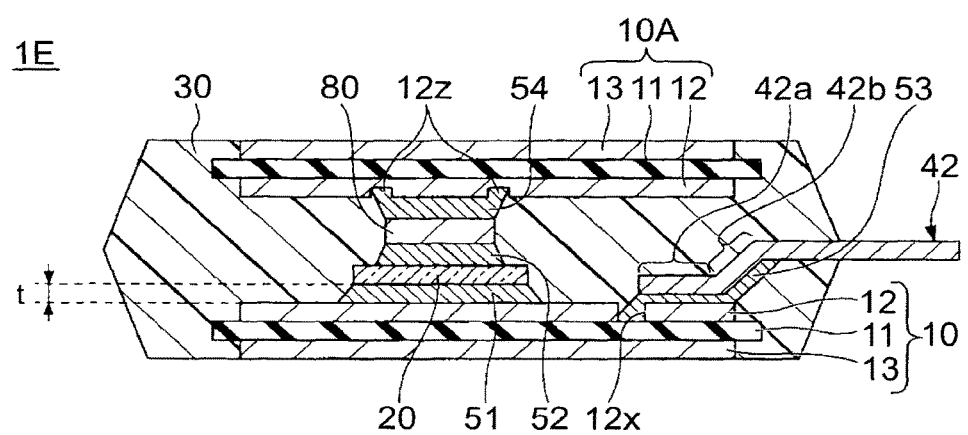
FIG. 12 is a cross-sectional view that shows a semiconductor device according to a sixth embodiment of the present invention.

FIG. 12 is a cross-sectional view that shows a semiconductor device according to a sixth embodiment. When referring to FIG. 12, a semiconductor device 1E is different from the semiconductor device 1 in points that a metal block 80 is disposed on the semiconductor element 20 via the solder layer 52, and the metal block 80 is fixed to the substrate 10A via a solder layer 54 (see FIG. 1 and the like). Although the substrate 10A is imparted with a different mark for convenience sake, it is a substrate having the same structure as the substrate 10. In FIG. 12, descriptions of constituent parts the same as those of the embodiments described above will be omitted.

Heat generated by the semiconductor element 20 is radiated via the substrates 10 and 10A. By disposing a heat radiation component on the second wiring layer 13 side of each of the substrate 10 and 10A, the heat radiation property may be further improved. Thus, in the semiconductor device 1E, since the heat generated by the semiconductor element 20 is radiated from both surface sides (upper surface side and lower surface side), the semiconductor device 1E can be called a double-sided cooling module.

In the semiconductor device 1E, in the first wiring layer 12 of the substrate 10A, the grooves 12z that do not penetrate through the first wiring layer 12 (see the fifth embodiment) are formed. Since the grooves 12z of the substrate 10A absorb the superfluous solder due to the capillary phenomenon, the solder layer 54 that fixes the metal block 80 to the substrate 10A does not outflow outside the grooves 12z.

Thus, the grooves 12z may be applied to parts other than the terminal. The situation is the same also in the solder outflow prevention parts shown in the other embodiments such as the groove 12x.

In the above, although preferable embodiments have been described in detail, the present invention is not limited to the embodiments described above. As far as there is no deviation from a gist of the present invention, various alterations and substitutions can be added to the embodiments described above.

For example, the respective embodiments can be properly combined. For example, in the first embodiment, the insulating material 60 may be disposed on the semiconductor element 20 side of the groove 12x. Thus, the superfluous solder can be more surely prevented from outflowing on the first wiring layer 12 on the semiconductor element 20 side.

What is claimed is:

1. A semiconductor device comprising:
    a substrate;
    a semiconductor element that is fixed on one side of the substrate via a first solder layer;
    a terminal that is fixed on the one side of the substrate via a second solder layer; and
    a solder outflow prevention part that is provided between the semiconductor element and the terminal in the one side of the substrate and that is configured to prevent the first solder layer and the second solder layer from outflowing, wherein
    a distance between the solder outflow prevention part and the semiconductor element is longer than a thickness of the first solder layer,
    the solder outflow prevention part is a groove formed on the one side of the substrate and a first end of the terminal is fixed above the groove,
    the first end of the terminal is fixed above an island portion exposed on the substrate and surrounded by the groove.

2. The semiconductor device according to claim 1, wherein the solder outflow prevention part is a groove formed on the one side of the substrate and a first end of the terminal is fixed above the groove.

3. The semiconductor device according to claim 2, wherein a connection part of the first end of the terminal is fixed to a position that overlaps with the groove in a plan view.

4. The semiconductor device according to claim 1, wherein
    the solder outflow prevention part is an insulating material disposed on the one side of the substrate,
    a height of the insulating material is larger than a sum total of a height of the second solder layer and a thickness of the terminal, and
    a tip of a first end of the terminal directly contacts with a side surface of the insulating material.

5. The semiconductor device according to claim 1, wherein
    the semiconductor element and the first end of the terminal are sealed with a sealing resin, and
    a second end of the terminal is exposed outside of the sealing resin.

6. The semiconductor device according to claim 1, wherein
    the substrate has a wiring layer, and
    the first solder layer and the second solder layer are electrically connected to the wiring layer and are formed on the wiring layer.

7. The semiconductor device according to claim 1, wherein
    the substrate has an insulating layer and a wiring layer formed on the insulating layer, the groove is formed in the wiring layer, and
    a bottom portion of the groove is constituted by a part of the wiring layer.

* * * * *